US012453698B2

(12) United States Patent
Ding et al.

(10) Patent No.: US 12,453,698 B2
(45) Date of Patent: Oct. 28, 2025

(54) PHARMACEUTICAL BIODISSOLVABLE GELS FOR DRUG DELIVERY

(71) Applicant: AIVIVA BIOPHARMA, INC., Las Vegas, NV (US)

(72) Inventors: Shulin Ding, Silver Spring, MD (US); Diane Tang-Liu, Las Vegas, NV (US)

(73) Assignee: AIVIVA BIOPHARMA, INC., Las Vegas, NV (US)

( * ) Notice: Subject to any disclaimer, the term of this patent is extended or adjusted under 35 U.S.C. 154(b) by 1153 days.

(21) Appl. No.: 17/297,329

(22) PCT Filed: Nov. 25, 2019

(86) PCT No.: PCT/US2019/063044
§ 371 (c)(1),
(2) Date: May 26, 2021

(87) PCT Pub. No.: WO2020/112655
PCT Pub. Date: Jun. 4, 2020

(65) Prior Publication Data
US 2022/0008336 A1   Jan. 13, 2022

Related U.S. Application Data

(60) Provisional application No. 62/771,529, filed on Nov. 26, 2018.

(51) Int. Cl.
| | | |
|---|---|---|
| *A61K 9/06* | (2006.01) | |
| *A61K 9/00* | (2006.01) | |
| *A61K 31/4439* | (2006.01) | |
| *A61K 31/47* | (2006.01) | |
| *A61K 47/10* | (2017.01) | |
| *A61K 47/12* | (2006.01) | |
| *A61K 47/20* | (2006.01) | |
| *A61K 47/26* | (2006.01) | |
| *A61K 47/38* | (2006.01) | |

(52) U.S. Cl.
CPC .............. *A61K 9/06* (2013.01); *A61K 9/0019* (2013.01); *A61K 9/0034* (2013.01); *A61K 9/0048* (2013.01); *A61K 31/4439* (2013.01); *A61K 31/47* (2013.01); *A61K 47/10* (2013.01); *A61K 47/12* (2013.01); *A61K 47/20* (2013.01); *A61K 47/26* (2013.01); *A61K 47/38* (2013.01)

(58) Field of Classification Search
CPC ...................................................... A61K 9/06
See application file for complete search history.

(56) References Cited

U.S. PATENT DOCUMENTS

| | | | |
|---|---|---|---|
| 4,861,760 A | 8/1989 | Mazuel et al. | |
| 5,252,318 A | 10/1993 | Joshi et al. | |
| 5,441,732 A * | 8/1995 | Hoeg .................... | A61K 47/18 514/913 |
| 2003/0194441 A1 | 10/2003 | Suzuki et al. | |
| 2016/0000890 A1 | 1/2016 | Yu et al. | |
| 2016/0082115 A1 | 3/2016 | Friberg et al. | |
| 2018/0228903 A1 * | 8/2018 | Kohane .................. | A61K 47/22 |

FOREIGN PATENT DOCUMENTS

| | | | |
|---|---|---|---|
| CN | 100430069 C | 2/2006 | |
| CN | 101273967 A | 10/2008 | |
| CN | 101701051 A1 | 1/2010 | |
| EP | 1568359 A1 | 8/2005 | |
| JP | 2003160473 A | 6/2003 | |
| JP | 2004196787 A | 7/2004 | |
| KR | 20050085367 A | 8/2005 | |
| KR | 20180030416 A | 3/2018 | |
| TW | 201536350 A | 10/2015 | |
| WO | 1994023750 A1 | 10/1994 | |
| WO | 2011035264 A1 | 3/2011 | |
| WO | WO-2016183296 A1 * | 11/2016 | ........... A61K 31/404 |
| WO | 2018022437 A2 | 2/2018 | |
| WO | 2018052053 A1 | 3/2018 | |
| WO | 2018148653 A1 | 8/2018 | |

OTHER PUBLICATIONS

International Search Report and Written Opinion, PCT/US2019/63044, mailed Feb. 6, 2020.
Office Action in related Taiwanese patent application No. 108143002, received Mar. 25, 2021; English translation also attached.
Shang, Z. et al., Temperature Sensitive Gel Study in China: Review & Prospects, Apr. 2014; contains English abstract.
Xu, S. et al., Chin J Mod Appl Pharm, vol. 33, No. 5, May 2016; contains English abstract.
Sekiguchi, Y. et al., Polymer Preprints, The Society of Polymer Science, Japan, vol. 48, No. 4, p. 771, Jun. 1999.
Notification of Reasons for Rejection dispatched from the Japanese Patent Office for Japanese Patent Application No. 2021-529404 on Apr. 26, 2022.
Decision of Rejection dispatched from the Japanese Patent Office for Japanese Patent Application No. 2021-529404 on Nov. 22, 2022.
European Search Report, European Patent Application No. 19891180 dated Nov. 12, 2021.
First Office Action issued by the China National Intellectual Property Administration for Chinese Patent Application No. 201980077430.4 dated on Jan. 6, 2024.
First Office Action issued by the Korean Intellectual Property Office for Korean Patent Application No. 10-2021-7019399 dated Jan. 25, 2024.
Office action dated Apr. 9, 2024 in Taiwan Application No. 108143002 and English Translation, 9 pgs.
Reconsideration Report by Examiner before Appeal in JP Patent Application No. 2022-116419 dated Aug. 27, 2024 (English Translation), 2 pgs.

(Continued)

*Primary Examiner* — John S Kenyon
*Assistant Examiner* — Rehana Ismail
(74) *Attorney, Agent, or Firm* — Procopio, Cory, Hargreaves & Savitch LLP; Brent Johnson

(57) ABSTRACT

This disclosure relates to a pharmaceutical bio-dissolvable/ bioerodible aqueous gel system optionally comprising an active pharmaceutical ingredient, wherein the pharmaceutical composition makes a transition from liquid to gel near the body temperature of a mammal These compositions may include a reversibly-gelling material, such as methylcellulose and a rheology modifier such as citrate.

19 Claims, 8 Drawing Sheets

(56) References Cited

OTHER PUBLICATIONS

Notification of Reasons for Rejection from the Japan Patent Office for Appeal Case No. 2023-4350, JP Application No. 2021-529404, dated Aug. 27, 2024, in English, 14 pages.
Iijima et al., Thermal Properties of Thermoreversible Polysaccharide Hydrogels, 2007 The Japan Society of Calorimetry and Thermal Analysis, 10 pgs.

\* cited by examiner

PHARMACEUTICAL BIODISSOLVABLE GELS FOR DRUG DELIVERY

CROSS-REFERENCE TO RELATED APPLICATIONS

This application is a national phase application of PCT/US2019/063044, filed on Nov. 25, 2019, which claims the benefit of U.S. Provisional Application No. 62/771,529, filed Nov. 26, 2018, which are incorporated by reference in their entirety.

FIELD

This disclosure relates to a pharmaceutical biodissolvable/bioerodible gel system for drug delivery. More particularly, the present disclosure relates to a biodissolvable aqueous gel system for treating, modifying, and/or preventing local diseases. Properties such as dissolvability, injectability, and drug release rate of the system can be controlled through ingredients and their concentrations.

BACKGROUND

One significant challenge in developing drug delivery systems is the maintenance of bioavailability of the drug at intended site(s) of actions over time. Depending upon the nature of the drug and the route of delivery, the bioavailability may be suboptimal due to, for example, the degradation of orally delivered drugs by hepato-gastrointestinal first-pass elimination, and/or rapid clearance of the drug from the site of application. The net results are that the dose administered and the frequency of dosing are required to be more than necessary to achieve therapeutic benefits while the undesirable adverse effects occur. Thus, it is desirable to be able to administer drugs with an efficient temporal course of drug availability to provide steady, prolonged, or sustained exposure of therapeutically meaningful amounts of drug while lowering propensity to trigger adverse effects and reducing dosing frequency for improved patient convenience and compliance.

SUMMARY

Some embodiments include a pharmaceutical composition comprising a reverse—thermal-gelation material, wherein the pharmaceutical composition makes a transition from liquid to gel near the body temperature of a mammal, such as near the body temperature of a human being.

Some embodiments include a pharmaceutical composition comprising an active pharmaceutical ingredient, wherein the pharmaceutical composition makes a transition from liquid to gel near mammalian body temperatures, and more preferably human body temperatures.

Some embodiments include a pharmaceutical composition comprising an active pharmaceutical ingredient, methylcellulose, and citrate.

Some embodiments include a pharmaceutical composition comprising an active pharmaceutical ingredient, methylcellulose, citrate and phosphate.

Some embodiments include a pharmaceutical composition comprising an active pharmaceutical ingredient, methylcellulose and phosphate.

Some embodiments include a pharmaceutical composition comprising an active pharmaceutical ingredient, methylcellulose, citrate and dimethyl sulfoxide.

Some embodiments include a pharmaceutical composition comprising an active pharmaceutical ingredient, methylcellulose, phosphate and dimethyl sulfoxide.

Some embodiments include a pharmaceutical composition comprising an active pharmaceutical ingredient, methylcellulose, citrate, phosphate and dimethyl sulfoxide.

Some embodiments include a method of treating a disease, comprising administering a pharmaceutical composition described herein to a mammal in need thereof.

Some embodiments include use of a pharmaceutical composition described herein in the manufacture of a medicament for treating a disease.

Some embodiments include a method of delivering an active pharmaceutical ingredient, comprising administering a pharmaceutical composition described herein to a mammal in need of the active pharmaceutical ingredient, wherein the method provides a therapeutic effect with a reduced active pharmaceutical ingredient dosing frequency. Active pharmaceutical dosing is dosing that is accompanied by action on the part of the patient or a person administering the drug. For example an injection, applying a topical composition, and swallowing an oral dosage form are examples of active pharmaceutical dosing. Thus, reducing active pharmaceutical ingredient dosing frequency involves reducing the frequency of injection, oral administration, topical administration, etc. Some dosing is not active, such as sustained delivery of a dosage form.

Some embodiments include a method of delivering an active pharmaceutical ingredient, comprising administering a pharmaceutical composition described herein to a mammal in need of the active pharmaceutical ingredient, wherein a single administration of the active pharmaceutical ingredient provides a therapeutically effective concentration of the active pharmaceutical ingredient to the mammal for at least 5 days, at least 1 week, at least 2 weeks, at least 3 weeks, at least 4 weeks, at least 5 weeks, at least 6 weeks, at least 7 weeks, at least 8 weeks, at least 9 weeks, at least 10 weeks, at least 12 weeks, at least 4 months, at least 5 months, at least 6 months, at least 9 months, at least 12 months, or longer.

Some embodiments include a method of preparing a pharmaceutical composition having reverse thermal gelation properties, comprising: mixing a polymer agent into a slurry containing a gelation modulator and an active pharmaceutical ingredient, wherein the mixing occurs at a temperature of about 60° C. to about 80° C.; wherein the slurry is formed by a method comprising precipitating the active pharmaceutical ingredient into an aqueous liquid, and adding the gelation modulator to the slurry.

DETAILED DESCRIPTION

Figure 1:
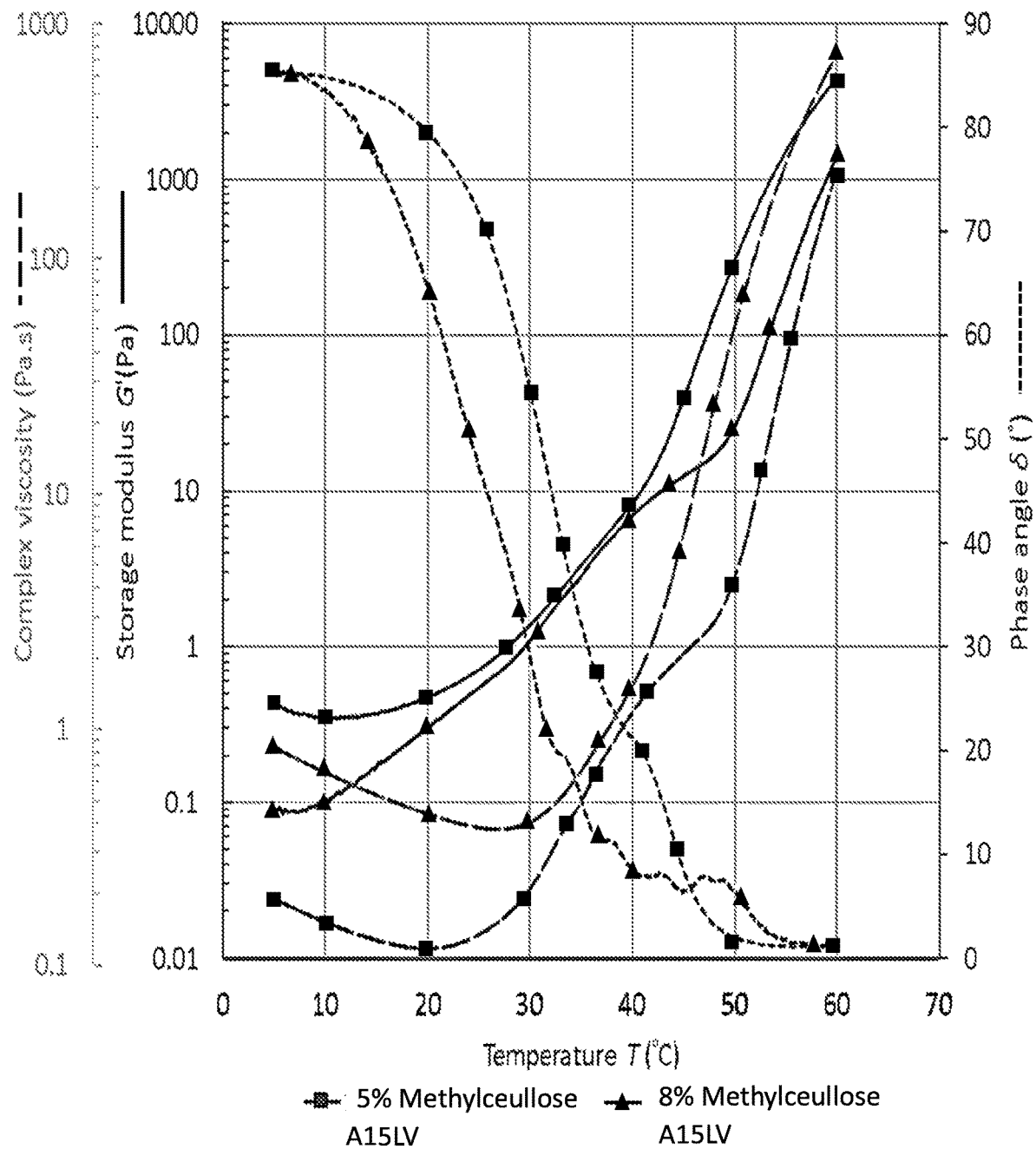
FIG. 1 shows temperature sweep Rheograms of Methylcelullose A15LV Aqueous Solutions at two different concentrations of methylcellulose.

Locally administered pharmaceutical gels are believed to have a potential to achieve the aforementioned, desirable drug-delivery attributes. However, most approved gel products are not syringeable and/or injectable via parenteral routes, and not droppable via topical routes. Furthermore, none of the marketed ophthalmic or dermatological gel products offer reduced dosing frequency and prolonged exposure when compared with the conventional eye/skin dosage forms such as solutions, suspensions, emulsions, lotions, creams, and ointments. When prolonged release is required for parenteral, topical and local indications, people have often had more success with multi-particulate systems, devices, implants, and/or inserts rather than gels.

Reverse thermal-gelling systems, e.g. systems having an increase in flowability as temperature decreases, can be effective in modulating drug retention and release after administration. Some of the challenges to overcome include ease of administration, dosage stability, and local and systemic toxicities, so that these systems can be used therapeutically.

Generally, this disclosure relates to pharmaceutical compositions (optionally containing an active pharmaceutical ingredient) with certain rheological properties. The pharmaceutical compositions described herein may be generally referred to as "a subject composition" or "subject compositions." Subject compositions are reversibly gelling compositions with particular properties. For example, a subject composition may make a transition from liquid to gel near the body temperature of a mammal, e.g. near the body temperature of a human, such as between about 0° C. and about 40° C. For example, the subject composition may be a liquid at around 2-8° C., such as 7° C., and solid at a higher temperature, such as about 30-40° C., such as 37° C. While subject compositions may be used in any route of administration, the properties of subject compositions may confer advantages for parenteral and topical routes over other dosage forms (such as inserts, implants, transdermal/topical patches, etc.) currently in use for the intended purposes of the subject compositions.

A subject composition may comprise a three-dimensional network-forming, gelling material.

Subject compositions have a number of potential advantages that may overcome limitations of existing gel technologies, such as the following:

1) A gel composition which becomes a semi-solid at near body temperature may not be able to pass through thin needles or long catheters required for administration. Some subject compositions have proper viscosity and elasticity properties before and during administration to address this challenge.

2) A gel composition which becomes a semi-solid at near body temperature may not timely undergo phase transition in vivo after administration into a body, tissue, or a body cavity if the gelation kinetics is too slow or too fast. Some subject compositions have a gel-sol transition that is kinetically favorable, e.g. sufficiently rapid, so as to ensure timely gel formation for the intended indication.

3) When a gel is formed in-vivo, the formed gel may be weak and may not persist long enough to exert meaningful drug release effect. On the other hand, an overly durable gel may not be desirable because it may persist long after all of the drug has been released from the gel, leaving an empty gel mass in the body. Some subject compositions have proper elasticity and viscosity that allows proper formation after administration and the gel would dissolve at rates compatible and comparable to those of the drug release.

The viscoelastic properties of subject compositions can be modulated such that they can be administered through thin needles, catheters, and/or devices, form a gel after administration, and have a proper dissolvability to give the desired residence time required for therapeutic benefits.

The subject compositions allow targeted drug delivery to local tissues which may be preferred over systemic drug administration. Targeted drug delivery has been employed to maximize the local drug exposure and minimize systemic side effects. However, in order to be a successful local drug delivery, a few features may need to be achieved, such as ease of administration, adequate local tolerability and safety, delivery at an appropriate dose and volume for the target tissue, and effective disease management. It may be desirable for the drug to be released over a suitable period of time to reduce a need for frequent administration, such as frequent injections. Increasing residence time in the target tissue can improve a local treatment method by reducing the frequency of repeated dosing. It is also desirable to improve ease of administration of the pharmaceutical composition, such as a subject composition, to improve the desirability and outcome of some local drug deliveries.

Surprisingly, many subject compositions provide a longer or modulated "residence" time of active agent in sufficient amounts to target tissues through local application as compared with conventional formulations such as injectable aqueous solutions or suspensions, and topical dosage forms. Some subject compositions can be administered to patients using conventional syringes/needles, and some can be administered using catheters or applicators.

Unless otherwise indicated, any reference to a compound such as an active pharmaceutical ingredient, or any other formulation component, includes pharmaceutically acceptable salts; acid forms; base forms; prodrugs; alternate solid forms, such as polymorphs, solvates, hydrates, tautomers, etc.; or any other chemical species that may rapidly convert to a compound described herein under conditions in which the compounds are used as described herein.

As mentioned above, some subject compositions include an active pharmaceutical ingredient in a reverse thermal gelation material, such as a reverse thermal gelation polymer, e.g. a reverse thermal gelation polymer dissolved or dispersed in water or an aqueous solution. Any suitable polymer having reverse thermal gelation may be used in a subject composition. U.S. Pat. Nos. 4,474,752, 4,478,822, and CA1072413, which are incorporated by reference herein, describe examples of polymers that may provide reverse thermal gelation properties to a subject composition. "Tetronic®" polyols by BASF Wyandotte Corporation and Pluronic® poloxamer polymers may also be used to provide reverse thermal gelation properties.

In some embodiments, the subject composition comprises at least one polymer agent, Preferably, the polymer agent comprises an alkylcellulose, such as a ($C_{1-6}$ alkyl)cellulose, including methylcellulose, ethylcellulose, etc.

In some embodiments, the subject composition comprises ($C_{1-6}$ alkyl)cellulose.

In some embodiments, the subject composition comprises ethylcellulose.

In some embodiments, the subject composition comprises methylcellulose. In some embodiments, the methylcellulose has a viscosity of about 1,000-2,000 mPas, about 1,400-1,600 mPas, or about 1500 mPas.

With respect to subject compositions comprising methylcellulose (such as methylcellulose A15LV), any suitable concentration of methylcellulose may be used, such as about 0.1-20% (w/w), about 2-10% (w/w), about 3-4% (w/w), about 4-5% (w/w), about 5-6% (w/w), about 6-7% (w/w), about 7-8% (w/w), about 8-9% (w/w), about 4-6% (w/w), about 6-8% (w/w), about 8-10% (w/w), about 4.6-4.8% (w/w), about 4.8-5% (w/w), about 5-5.2% (w/w), about 5.2-5.4% (w/w), about 5.4-5.6% (w/w), about 5.6-5.8% (w/w), about 6.6-6.8% (w/w), about 6.8-7% (w/w), 7-7.2% (w/w), about 7.2-7.4% (w/w), about 7.4-7.6% (w/w), about 7.6-7.8% (w/w), about 4.5-5.5% (w/w), about 4.8-5.2% (w/w), about 6.8-7.2% (w/w), about 6.5-7.5% (w/w), about 3-9% (w/w), or 3-12% (w/w).

With respect to subject compositions comprising methylcellulose, the degree of methoxylation of methylcellulose may be about 10-50%, about 10-15%, about 15-20%, about 20-25%, about 25-30%, about 30-35%, about 35-40%, about 40-45%, about 45-50%, about 20-22%, about 22-24%, about 24-26%, about 26-28%, about 28-30%, about 30-32%, about 32-34%, about 34-36%, about 36-38%, about 38-40%, or about 20%-35%.

Aqueous solutions of methylcellulose have reverse thermal gelation properties. However, some methylcellulose solutions have a gelation temperature that is outside of the body temperature range. Additionally, viscoelastic properties of some methylcellulose aqueous solutions are often such that they are not feasible for pharmaceutical manufacture at a large scale or administration to patients in a clinical setting.

A subject composition may contain at least one gelation modulator. A gelation modulator may modify characteristics such as gelation onset temperature, gelation kinetics, gelation temperature, elasticity profile as function of temperature, etc. The gelation modulators may be a substance such as a salt, a buffer, a solvent, a surfactant, another material, or a combination thereof. In some embodiments, several gelation modulators (such as 2, 3, 4, 5, 6, 7, 8, 9, 10, or more) could be used in one formulation in order to produce a formulation that can feasibly deliver the active pharmaceutical agent.

Examples of suitable gelation modulators may include phosphate, dihydrogen phosphate, hydrogen phosphate, tris(hydroxymethyl)aminomethane, borate, histidine, carbonate, bicarbonate, citrate, citric acid acetate, tartrate, fumarate, lactate, formate, sulfamate, oxalate, malonate, succinate, maleate, adipate, benzoate, o-toluate, benzene tetracarboxylate, glutamate, e-amino caproate, aspartate, glycinate, arginate, lysinate, taurate, ethanol, dimethyl sulfoxide, glycerin, dimethylformamide, propylene glycol, a polyethylene glycol, a vegetable oil, corn oil, olive oil, castor oil, vitamin E, a phospholipid, a polysorbate 20, a polysorbate 40, a polysorbate 60, a polysorbate 80, a monosaccharide, a di-saccharide, dextrose, sucrose, a sugar alcohol, mannitol, sorbitol, an antioxidant, ascorbic acid, butylated hydroxyanisole, butylated hydroxytoluene, sodium bisulfate, sodium sulfite, sodium metabisulfite, EDTA, sodium carboxymethylcellulose, sodium alginate, hydroxypropylmethylcelluloses, carbomers, hyaluronic acid, a hyaluronate salt, etc., or a combination thereof. In some embodiments, the gelation modulator comprises phosphate. In some embodiments, the gelation modulator comprises dimethyl sulfoxide. In some embodiments, the gelation modulator comprises citrate.

Suitable buffers (for use as a gelation modulator, or for buffering purposes unrelated to gelation modulation) may include phosphate, dihydrogen phosphate, hydrogen phosphate, tris-(hydroxymethyl)aminomethane, borate, histidine, carbonate, bicarbonate, citrate, acetate, tartarate, fumarate, lactate, formate, sulfamate, oxalate, malonate, succinate, maleate, adipate, benzoate, o-toluate, benzene tetracarboxylate, glutamate, e-amino caproate, aspartate, glycinate, arginate, lysinate, taurate, etc., or a combination thereof. In some embodiments, the pharmaceutical composition comprises citrate, including citric acid, any salt of citric acid, or a combination thereof. In some embodiments, the pharmaceutical composition comprises phosphate, including phosphoric acid, any salt of phosphoric acid, or a combination thereof. In some embodiments, several buffers could be used in combination in a single formulation.

For those pharmaceutical compositions comprising citrate, any suitable concentration of citrate (including citric acid, a salt of citric acid, a combination of salts of citric acid, or a combination of one or more salts of citric acid and citric acid) may be used, such as 1-200 mmole/kg, about 25-200 mmole/kg, about 50-100 mmole/kg, about 100-150 mmole/kg, about 80-100 mmole/kg, about 100-120 mmole/kg, about 120-140 mmole/kg, about 96-98 mmole/kg, about 98-100 mmole/kg, about 100-102 mmole/kg, about 102-104 mmole/kg, about 104-110 mmole/kg, about 110-112 mmole/kg, about 112-114 mmole/kg, about 114-116 mmole/kg, about 116-118 mmole/kg, about 118-120 mmole/kg, about 120-122 mmole/kg, about 97-99 mmole/kg, about 99-101 mmole/kg, about 101-103 mmole/kg, about 103-108 mmole/kg, about 108-113 mmole/kg, about 113-115 mmole/kg, about 115-117 mmole/kg, about 117-119 mmole/kg, about 90-110 mmole/kg, or about 110-130 mmole/kg.

For those pharmaceutical compositions comprising phosphate, any suitable concentration of phosphate may be used, such as 1-200 mmole/kg, about 50-100 mmole/kg, about 100-150 mmole/kg, about 80-100 mmole/kg, about 100-120 mmole/kg, about 120-140 mmole/kg, about 96-98 mmole/kg, about 98-100 mmole/kg, about 100-102 mmole/kg, about 102-104 mmole/kg, about 110-112 mmole/kg, about 112-114 mmole/kg, about 114-116 mmole/kg, about 116-118 mmole/kg, about 118-120 mmole/kg, about 120-122 mmole/kg, about 97-99 mmole/kg, about 99-101 mmole/kg, about 101-103 mmole/kg, about 113-115 mmole/kg, about 115-117 mmole/kg, about 117-119 mmole/kg, about 90-110 mmole/kg, or about 110-130 mmole/kg.

Hydrophilic solvents or hydrophobic solvents may also be used as gelation modulators or for other purposes. Suitable hydrophilic solvents include ethanol, dimethyl sulfoxide, glycerin, dimethylformamide, propylene glycol, and polyethylene glycols. Suitable hydrophobic solvents include vegetable oils (corn oil, olive oil, castor oil, etc.), vitamin E, and phospholipids.

For those pharmaceutical compositions comprising dimethyl sulfoxide, any suitable concentration of dimethyl sulfoxide may be used, such as such as about 0.1-50% (w/w), about 0.1-20% (w/w), about 0.1-10% (w/w), about 0.1-1% (w/w), about 1-10% (w/w) about 10-20% (w/w) about 20-30% (w/w) about 30-40% (w/w), about 40-50% (w/w), about 0.1-8% (w/w), about 1-2% (w/w), about 2-3% (w/w), about 3-4% (w/w), about 4-5% (w/w), about 5-6% (w/w), about 6-7% (w/w), about 4-6% (w/w), about 6-8% (w/w), about 8-9% (w/w), about 9-10% (w/w), about 10-12% (w/w), about 4.8-5% (w/w), about 5-5.2% (w/w), about 5.2-5.4% (w/w), about 4.5-5.5% (w/w), about 4.8-5.2% (w/w), about 3-9% (w/w), about 9-11% (w/w), or about 3-12% (w/w).

Other materials that may be used as gelation modulators include surfactants (such as polysorbates 20, 40, 60 and 80, and phospholipids), mono- or di-saccharides (such as dextrose, sucrose, etc.), sugar alcohols (such as mannitol and sorbitol, etc.), antioxidants (such as Vitamin E, ascorbic acid, butylated hydroxyanisole, butylated hydroxytoluene, sodium bisulfate, sodium sulfite, sodium metabisulfite, etc.), chelating agents such as EDTA, suspending agents (such as sodium carboxymethylcellulose, sodium alginate, etc.) and viscosity enhancing agents (such as hydroxypropylmethylcelluloses, carbomers, hyaluronate, etc.).

The pharmaceutical composition may have any suitable pH, such as about 4-9, about 5-9, about 6-8, about 6-7, about 7-8, about 7-7.3, about 7.3-7.6, about 7.6-7.9, about 7.2-7.6, or about 7.4.

In some embodiments, the composition may contain less than 20%, less than 10%, less than 5%, or less than 0.5% polyethylene glycol, or may be substantially free, or completely free, of polyethylene glycol.

In some embodiments, the composition may contain less than 20%, less than 10%, less than 5%, less than 2.5% or less than 0.5% dimethyl sulfoxide, or may be substantially free, or completely free, of dimethyl sulfoxide.

In some embodiments, the composition may contain less than 20%, less than 10%, less than 5%, less than 2.5% or less than 0.5% glycerin, or may be substantially free, or completely free, of glycerin.

In some embodiments, the composition may contain less than 20%, less than 10%, less than 5%, less than 2.5% or less than 0.5% sucrose, or may be substantially free, or completely free, of sucrose.

In some embodiments, the composition may contain less than 20%, less than 10%, less than 5%, less than 2.5% or less than 0.5% polysorbate 80, or may be substantially free, or completely free, of polysorbate 80.

In some embodiments, the composition may contain less than 20%, less than 10%, less than 5%, less than 2.5% or less than 0.5% polysorbate 60, or may be substantially free, or completely free, of polysorbate 60.

In some embodiments, the composition may contain less than 20%, less than 10%, less than 5%, less than 2.5% or less than 0.5% polysorbate 40, or may be substantially free, or completely free, of polysorbate 40.

In some embodiments, the composition may contain less than 20%, less than 10%, less than 5%, less than 2.5% or less than 0.5% polysorbate 20, or may be substantially free, or completely free, of polysorbate 20. Salts, such as NaCl, KCl, $Na_2SO_3$, $MgCl_2$, $FeCl_3$, $Na_3PO_4$, etc., may also be used as gelation modulators, or for other purposes.

A subject composition may further contain a tonicity agent such as sodium chloride, glycerin, mannitol, dextrose, potassium chloride, etc.

A subject composition can include any desired active pharmaceutical ingredient or drug, such as but not limited to, an anti-angiogenic, an antibiotic, an antifungal, an antihistamine, an anti-inflammatory, an antineoplastic, an antiviral, a biologic, a pressure-lowering agent, a genitourinary tract agent, a hormone, or a steroid, or drug intended for dermatological, gastroenteral, nasal, oncologic, ophthalmic, otic, pain-relief, respiratory, or urovaginal uses.

The subject composition may provide advantages as compared to water-insoluble drugs. To this end, subject compositions may contain dispersed solid particles of a water-insoluble drug. Solid particles can be drug itself, microspheres or microcapsules of an active pharmaceutical ingredient, nanoparticles of an active pharmaceutical ingredient, or drug bound/associated to a polymer through a covalent bond or an ionic bond. Subject compositions may also, or alternatively, contain dispersed globules of a hydrophobic solvent in which a water-insoluble drug is dissolved. Some water-insoluble drugs that may benefit from use in a subject composition include steroids, NSAIDs, tyrosine kinase inhibitors, anticancer agents, antibiotics, prostaglandins, immunomodulators, hormones (and their agonists and antagonists), etc.

In some embodiments, the active pharmaceutical ingredient may include a multi-kinase inhibitor, e.g. axitinib, nintedanib, pirfenidone, riociguat, sorafenib, sunitinib, lenvatinib, regorafenib, ponatinib, pazopanib, etc.

The subject composition may have rheological properties that are temperature dependent. Examples of subject compositions and rheograms are shown in Examples 1-17 and FIGS. 1-4. The phase angle δ tracing as a function of temperature describes gelation kinetics, showing gelation onset temperature and the gelation speed as temperature increases. The phase shift δ is inversely related to and is used to determine the % gelation for a specific temperature. For intravitreal injection, a delayed onset with sudden, quick gelation is more desirable than early onset with gradual gelation. The Storage Modulus (G') tracing shows the increase in solid property (elasticity) as temperature increases. The G' value at near body temperature predicts the gel strength, which is related to gel durability. The higher G' a composition is at near body temperature, the more durable the gel should be.

The intercept of G' tracing suggests injectability. Intercept values close to or lower than about 0.1, such as about 0.05-0.07, about 0.07-0.1, about 0.1-0.3, or about 0.3-0.5, are more favorable for applications which require a thin needle for administration. The same principle should apply to the tracing of complex viscosity as function of temperature, i.e. intercept values close to or lower than about 0.1, such as about 0.05-0.07, about 0.07-0.1, about 0.1-0.3, or about 0.3-0.5, are more favorable for applications which require a thin needles for administration.

The slope of G' tracing as a function of temperature suggests the composition's propensity for congealing. A negative slope in cool temperature range would be more desirable for indications which require the use of a long catheter. In some embodiments, G' has a slope of about −0.001-0.003, about −0.003-0.007, about −0.007-0.01, about −0.01-0.015, or about −0.012-0.02 at about 2-8° C., about 5-15° C., about 5-20° C., or about 5-25° C.

In some embodiments, a subject composition has a first storage modulus (G') at about 37° C. and a second G' at about 5° C., wherein the first G' is higher than the second G', such as at least about 5-fold higher, at least about 8-fold higher, at least about 10-fold higher, at least about 20-fold higher, at least about 50-fold higher, at least about 100-fold higher, at least about 500-fold higher, or at least about 1000-fold higher.

In some embodiments, a subject composition has a first complex viscosity at about 37° C. and a second complex viscosity at about 5° C., wherein the first complex viscosity is higher than the second complex viscosity, such as at least about 1.5-fold higher, at least about 2-fold higher, at least about 5-fold higher, at least about 10-fold higher, at least about 20-fold higher, at least about 50-fold higher, or at least about 100-fold higher.

In some embodiments, a subject composition has a first loss modulus (G") at about 37° C. and a second G" at about 5° C., wherein the first G" is higher than the second G".

In some embodiments, a subject composition has a % gelation at about 37° C. that is at least 70%, at least about 75%, at least about 80%, at least about 85%, at least about 90%, at least about 95%, or at least about 99%.

In some embodiments, a subject composition has a % gelation between about 30° C. and 40° C. that is at least 70%, at least about 75%, at least about 80%, at least about 85%, at least about 90%, at least about 95%, or at least about 99%.

In some embodiments, a subject composition has a % gelation between about 2° C. and about 8° C. that is no greater than about 20%, no greater than about 10%, no greater than about 5%, no greater than about 3%, or no greater than about 1%.

A subject composition may be administered to a mammal in order to deliver the active pharmaceutical ingredient to the mammal, wherein the mammal is in need of said active pharmaceutical ingredient. In some embodiments, the composition may reduce active pharmaceutical ingredient dosing frequency. In some embodiments, a single administration of the active pharmaceutical ingredient provides a therapeutically effective concentration of the active pharmaceutical ingredient to the mammal for at least 5 days, at least 1 week, at least 2 weeks, at least 3 weeks, at least 4 weeks, at least 5 weeks, at least 6 weeks, at least 7 weeks, at least 8 weeks, at least 9 weeks, at least 10 weeks, at least 12 weeks, at least 4 months, at least 5 months, at least 6 months, at least 9 months, at least 12 months, or longer. This may be accomplished by any route of administration, including topical, intralesional injection, perilesional injection, intravitreal injection, intraprostatic injection, intramuscular injection, subcutaneous injection, intradermal injections, intra-tissue injection, or by eye drop.

Figure 4:
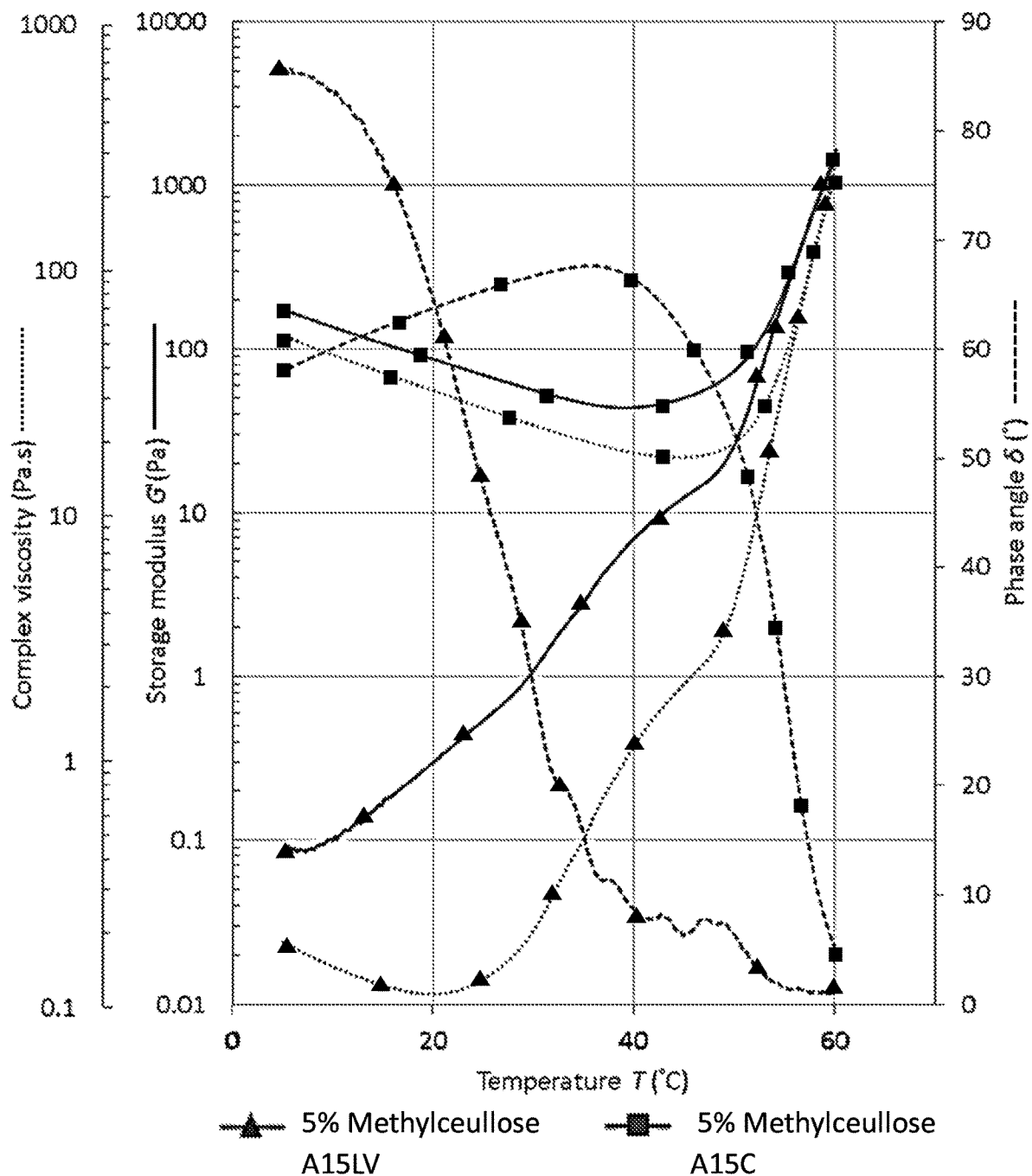
FIG. 4 shows temperature sweep rheograms of some subject compositions having different types of methylcellulose.

In some embodiments, a subject composition is obtained by mixing methylcellulose of a suitable molecular weight and viscosity with a buffer and/or a tonicity agent. Not all methylcelluloses possess the viscoelastic properties which are most desirable for pharmaceutical manufacturing, or properties that are most suitable for administration to patients in clinical setting. Shown in FIG. 4 is a temperature-sweep rheogram for two types of methylcellulose (A15LV and A15C) at 5%. A15C has a higher molecular weight than A15LV. The temperature-sweep rheogram indicates that A15LV at 5% concentration is shown to have viscoelastic properties that are feasible for formulating into parenteral preparations. Furthermore, methylcellulose A15C may be too viscoelastic to be syringeable/injectable at 5%.

Furthermore, the concentration of methylcellulose A15LV may need to be above 3% in order to have the gel-sol phase transition near the body temperature.

Figure 2:
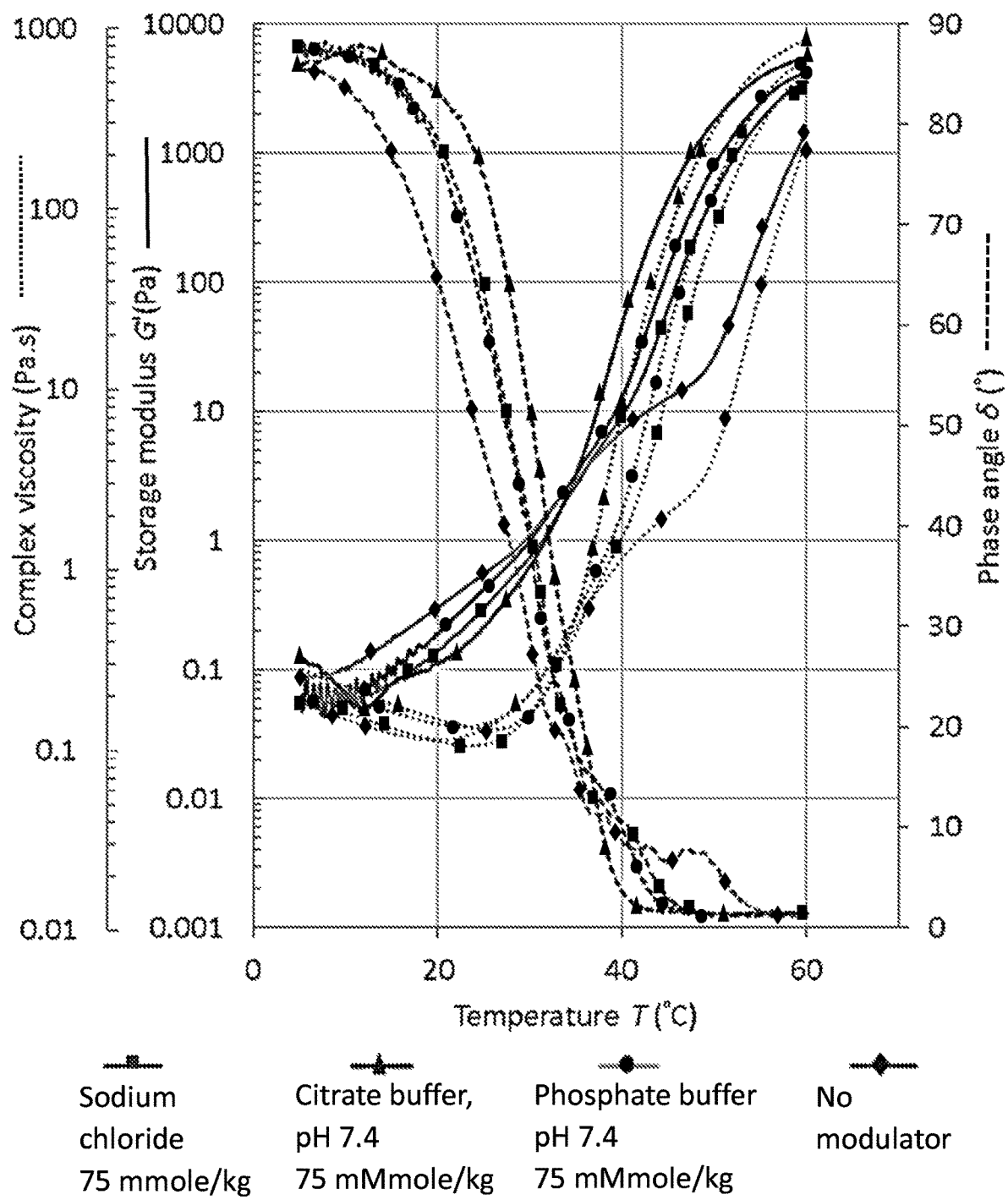
FIG. 2 shows temperature sweep rheograms of some subject compositions having different modulators.
Figure 3:
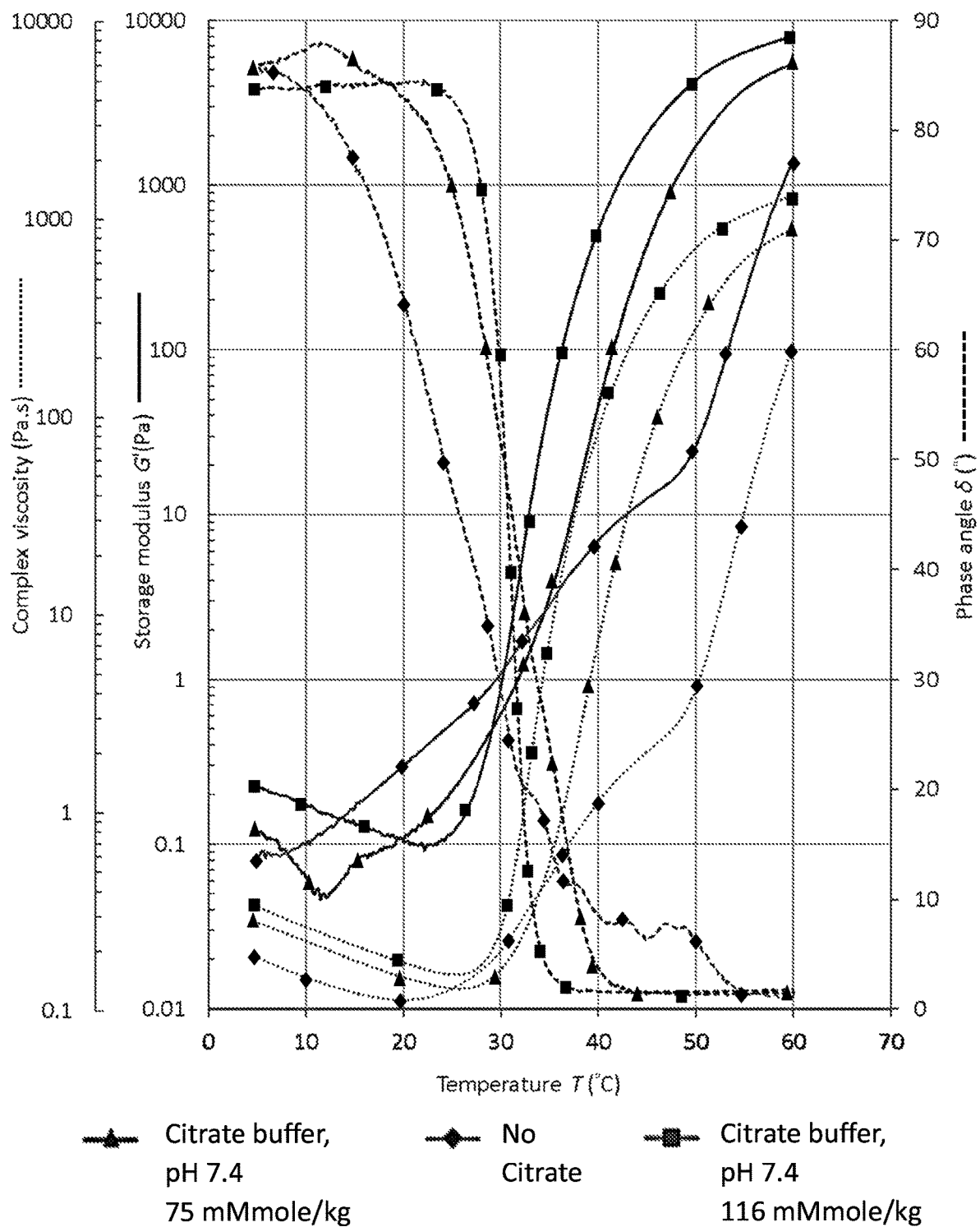
FIG. 3 shows temperature sweep rheograms of some subject compositions having different citrate buffer concentrations.

It has been discovered that some gelation modulators are more effective than the others (FIGS. 2 and 3). Citrate buffer at 116 mmole/kg is surprisingly found to be able to significantly increase gel elasticity at 37° C. As a result, gel dissolvability in vivo is expected to be much reduced (i.e., increase gel residence time). Furthermore, Citrate buffer at 116 mmole/kg is surprisingly found to be able to change the slope of the profile from positive to negative for elasticity in the temperature range of 5° C. to 25° C., when compared with the elasticity profile without citrate buffer or with only 75 mmole/kg (FIG. 3). The negative slope in the temperature range of 5° C. to 25° C. suggests that the formulation that contains 116 mmole/kg citrate would have lower congealing risk when being administered through a needle or catheter.

For some subject compositions, the desired particle size of a poorly water-soluble drug is produced/controlled/influenced through a controlled precipitation process prior to being dispersed in the aqueous solutions of methylcellulose with a desired gelation temperature, pH, and tonicity. The precipitation may be triggered through a change in pH, solvency, tonicity, or temperature. The precipitate may have a different crystalline habit from the purchased raw material, resulting in a different drug release rate. Table 3 shows four methods of incorporating water insoluble drugs into subject compositions. The impact of gel strength and controlled precipitation on in-vitro drug release rate is presented in FIG. 5.

In some subject compositions, aqueous solutions of methylcellulose are formulated with proper buffers and tonicity agents so that the solutions can have a pH value and a tonicity that are suitable for the intended pharmaceutical use.

Subject compositions comprising an aqueous solution of methylcellulose with a desired gelation temperature, pH, and tonicity and in which one or multiple active pharmaceutical ingredients are dispersed, may be administered to patients via intravitreal, intraprostatic, intramuscular, subcutaneous, or intradermal injections to treat/prevent/manage local diseases.

A subject composition can be locally administered (through injection using needles or through applicators) to target tissues such as eyes (ocular surface, anterior and posterior segments), prostate, urinary bladder, uterus, vaginal, skin, tongue, gum, oral cavity, nose, sinus, joints, etc., and various solid tumors. When formulated with one or multiple drugs, the subject compositions can transport active agents to treat local diseases in the aforementioned target tissues. The drugs can be water soluble or water insoluble. The gel compositions can be designed over a relatively wide range of conditions so that they are a liquid at cool or room temperature and can undergo a phase transition into a semi-solid when warming up to the body temperature, making them particularly suitable.

Subject compositions provide advantages for use as droppable or injectable products because they are flowable for dropping, instillation or injection, and gel when they come into contact with the body. They also provide advantages in the controlled delivery of active pharmaceutical ingredients and/or diagnostic agents to local tissues.

Some subject compositions may be used for prevention or treatment of a disease or disorder characterized by chronic inflammation, with associated angiogenesis and fibrosis. In some embodiments, the disease or disorder includes dermal-related disorders, benign prostate hyperplasia related disorders, eye-related disorders, rosacea-related disorders, uterine fibroids and related conditions, neoplastic diseases and adhesion-related disorders. In some embodiments, the pharmaceutical bio-dissolvable/bioerodible aqueous gel system may include dispersed therein at least one active pharmaceutical ingredient, such as an active pharmaceutical ingredient designed for anti-angiogenesis, including a multi-kinase inhibitor, such as axitinib, nintedanib, pirfenidone, riociguat, sorafenib, sunitinib, lenvatinib, regorafenib, ponatinib, or pazopanib.

In some embodiments, the multi-kinase inhibitor, such as axitinib, nintedanib, pirfenidone, riociguat, sorafenib, sunitinib, lenvatinib, regorafenib, ponatinib, or pazopanib, is present in subject composition at a concentration of about 0.01-5% (wt/wt), about 0.1-1% (wt/wt), about 1-2% (wt/wt), about 2-3% (wt/wt), about 3-4% (wt/wt), about 4-5% (wt/wt), about 0.01-0.5% (wt/wt), about 0.5-1% (wt/wt), about 1-1.5% (wt/wt), about 1.5-2% (wt/wt), about 2-2.5% (wt/ wt), about 2.5-3% (wt/wt), about 3-3.5% (wt/wt), about 3.5-4% (wt/wt), about 4-4.5% (wt/wt), about 4.5-5% (wt/wt), 0.01-0.1% (wt/wt), about 0.1-0.2% (wt/wt), about 0.2-0.3% (wt/wt), about 0.3-0.4% (wt/wt), about 0.4-0.5% (wt/wt), about 0.5-0.6% (wt/wt), about 0.6-0.7% (wt/wt), about 0.7-0.8% (wt/wt), about 0.8-0.9% (wt/wt), about 0.9-1% (wt/wt), about 1-1.1% (wt/wt), about 1.1-1.2% (wt/wt), about 1.2-1.3% (wt/wt), about 1.3-1.4% (wt/wt), about 1.4-1.5% (wt/wt), about 1.5-1.6% (wt/wt), about 1.6-1.7% (wt/wt), about 1.7-1.8% (wt/wt), about 1.8-1.9% (wt/wt), about 1.9-2% (wt/wt), about 2-2.2% (wt/wt), about 2.2-2.4% (wt/wt), about 2.4-2.6% (wt/wt), about 2.6-2.8% (wt/wt), about 2.8-3% (wt/wt), about 3-3.3% (wt/wt), about 3.3-3.6% (wt/wt), about 3.6-3.9% (wt/wt), about 3.9-4.3% (wt/wt), about 4.3-4.7% (wt/wt), about 4.7-5.1% (wt/wt), about 0.9-1.1% (w/w), or about 1% (wt/wt).

In some embodiments, the administering is by a topical formulation, intralesional injection, perilesional injection, eye drop, or by intra-tissue injection.

The term "treating" or "treatment" broadly includes any kind of treatment activity, including the diagnosis, cure, mitigation, or prevention of disease in human beings or other mammals, or any activity that otherwise affects the structure or any function of the body of human beings or other mammals.

The terms drug and active pharmaceutical ingredient may be interchangeably used.

Subject compositions/gel formulations that do not contain drug can be prepared as follows. This method is one example and may be successfully modified by a person skilled in the art.

1. Combine the prescribed amount of ingredients (buffers, salts, solvents, etc.) except methylcellulose in an appropriate amount of water according to the formulation composition. Heat the mixture to approximately 60-80° C., preferably 67-70° C. with constant mixing.

2. Weigh accurately an appropriate amount of methylcellulose and add the powder to the hot mixture while constantly mixing. When the cellulose is well dispersed, remove the heat source, bring the batch to the target weight with water, and continue mixing until the dispersion is cooled to ambient temperature. Chill the dispersion overnight to allow full hydration of cellulose and produce the final subject composition/gel formulation without drug that exhibits appropriate/desired reverse thermal gelation properties.

3. The chilled bulk gel formulation is filled into Type 1 glass serum vials and sealed with silicone coated stoppers and aluminum crimp top. The filled and sealed vials are terminally sterilized.

Subject compositions containing a water insoluble drug may be prepared as follows. This method is one example and may be successfully modified by a person skilled in the art.

1. Preparation of a Highly Concentrated Drug Stock Solution Using a Suitable Solvent A highly concentrated drug stock solution is prepared freshly by combining accurate amounts of the drug and a suitable solvent. After dissolving the drug in the solvent, the resulting solution may be filtered through a sterilization grade filter before use.

2. Preparation of Phase 1 Drug Slurry Through Controlled Precipitation

Precipitate the drug by adding an accurate amount of the drug stock solution dropwise into a suitable and accurate amount of water according to the formulation composition while constant mixing. The resultant slurry is homogenized by a homogenizer for a suitable amount of time and at a proper speed.

3. Preparation of Final Subject Composition/Gel Formulation with Drug

Accurately weigh out an appropriate amount of Phase 1 drug slurry, and combine it with appropriate amounts of solvent, buffer, salts, etc. except methylcellulose. Heat the mixture to approximately 60-80° C., preferably 67-70° C. with constant mixing. Weigh accurately an appropriate amount of methylcellulose and add the powder to the hot slurry while constantly mixing. When the cellulose is well dispersed, remove the heat source, bring the batch to the target weight with water, and continue mixing until the dispersion is cooled to ambient temperature. Chill the dispersion overnight to allow full hydration of cellulose and produce the final subject composition with drug that exhibits appropriate/desired reverse-thermal-gelation properties.

4. Filling and Terminal Sterilization

The chilled bulk gel formulation with drug is filled into Type 1 glass serum vials, and sealed with silicone coated stoppers and aluminum crimp top. The filled and sealed vials are terminally sterilized.

Examples 1-20

Composition Examples 1-17 were prepared as described above with the formulas shown in Tables 1 to 6 below.

TABLE 1

Mono gelation modulator formulation systems with citrate

| Ingredients | Example 1 | Example 2 |
| --- | --- | --- |
| Methylcellulose A 15LV | 5% w/w | 5% w/w |
| Citrate buffer pH 7.4 | 116 mmole/kg | 100 mmole/kg |
| Water for Injection | QS | QS |

TABLE 2

Dual gelation modulator formulation system and triple gelation modulator formulation system.

| Ingredients | Example 3* | Example 4* | Example 5 | Example 6 | Example 7 | Example 8 |
| --- | --- | --- | --- | --- | --- | --- |
| Lenvatinib | 1% w/w | 1% w/w | 1% w/w | 1% w/w | 1% w/w | 2% w/w |
| DMSO | 5% w/w | 5% w/w | 5% w/w | — | 5% w/w | — |
| Methylcellulose A 15LV | 5% w/w | 5% w/w | 5% w/w | 5% w/w | 5% w/w | 5% w/w |
| Citrate buffer pH 7.4 | 100 mmole/kg | 100 mmole/kg | 116 mmole/kg | 116 mmole/kg | 116 mmole/kg | 116 mmole/kg |

TABLE 2-continued

Dual gelation modulator formulation system and triple gelation modulator formulation system.

| Ingredients | Example 3* | Example 4* | Example 5 | Example 6 | Example 7 | Example 8 |
|---|---|---|---|---|---|---|
| Dibasic sodium phosphate | — | — | — | — | 0.06% w/w | 0.06% w/w |
| Water for Injection | QS | QS | QS | QS | QS | QS |

Examples 3 and 4 are identical in formulation composition but differ in the manner in which the slurry of the active pharmaceutical ingredient (API) is formed.

TABLE 3

Mono gelation modulator formulation systems with dimethyl sulfoxide (DMSO)

| Ingredients | Example 9 | Example 10 | Example 11 | Example 12 | Example 13 |
|---|---|---|---|---|---|
| Methylcellulose A 15LV | 5% w/w | 5% w/w | 5% w/w | 5% w/w | 7% w/w |
| DMSO | 0% | 2.5% w/w | 5% w/w | 10% w/w | 0% w/w |
| Water for injection | QS | QS | QS | QS | QS |

Examples 9, 10, 11, 12 and 13 were prepared following final bulk gel formulation process without drug described herein and then studied for gelation at 37° C. For this study, 1 mL of Examples 8, 9, 10, 11 and 12 were taken in 2 mL glass vials, capped, and placed in a 37° C. water bath. The vials were taken out of the water bath at 0.5 h, 1 h and 2 h and checked for gel formation using the inverting flow test method. For this test, the vials were taken out of the water bath and then inverted for 5-6 secs. When the solution remained inverted without running/flowing, then the term "gel" is used indicating "Gel" formation, and if it flowed, indicating "Not" for no gel formation/gelation. Table 4 shows that DMSO can function as a gelation modulator for methylcellulose at all three DMSO concentrations studied (2.5%, 5% and 10%).

TABLE 4

Inverting flow test method results of freshly prepared examples for gelation at 37° C.

| Example | After 0.5 h | After 1 h | After 2 h |
|---|---|---|---|
| Example 9 | Not | Not | Not |
| Example 10 | Not | Not | Almost |
| Example 11 | Not | Gel | Gel |
| Example 12 | Gel | Gel | Gel |
| Example 13 | Not | Gel | Gel |

TABLE 5

Examples of compositions with active pharmaceutical ingredients

| Ingredients | Example 14 | Example 15 | Example 16 |
|---|---|---|---|
| Ketorolac free acid | 2% w/w | — | — |
| Bimatoprost | — | 0.5% w/w | — |
| Travoprost | — | — | 0.5% w/w |
| DMSO | 2.5% w/w | — | — |
| Ethanol | — | 2.5% w/w | 2.5% w/w |
| Tween 80 | — | 0.25% w/w | 0.25% w/w |
| Methylcellulose A 15LV | 5% w/w | 5% w/w | 5% w/w |
| Citrate buffer, pH 4.8 | 116 mmole/kg | 116 mmole/kg | 116 mmole/kg |
| Water for Injection | QS | QS | QS |

Examples 14-16 were prepared by the method described herein. Example 14 formed a gel and was not flowable at 37° C. Examples 15 and 16 did not form a gel and were flowable at 37° C.

TABLE 6

Example of composition with Axitinib as active pharmaceutical ingredient

| Ingredients | Example 17 |
|---|---|
| Axitinib | 1% w/w |
| DMSO | 5% w/w |
| Methylcellulose A 15LV | 5% w/w |
| Citrate buffer pH 7.4 | 116 mmole/kg |
| Dibasic sodium phosphate | — |
| Water for Injection | QS |

Example 17 was prepared using a method similar to that used for Examples 3 to 8, with Axitinib as the active pharmaceutical ingredient. Example 17 formed a gel and was not flowable at 37° C.

Example 18

Figure 5:
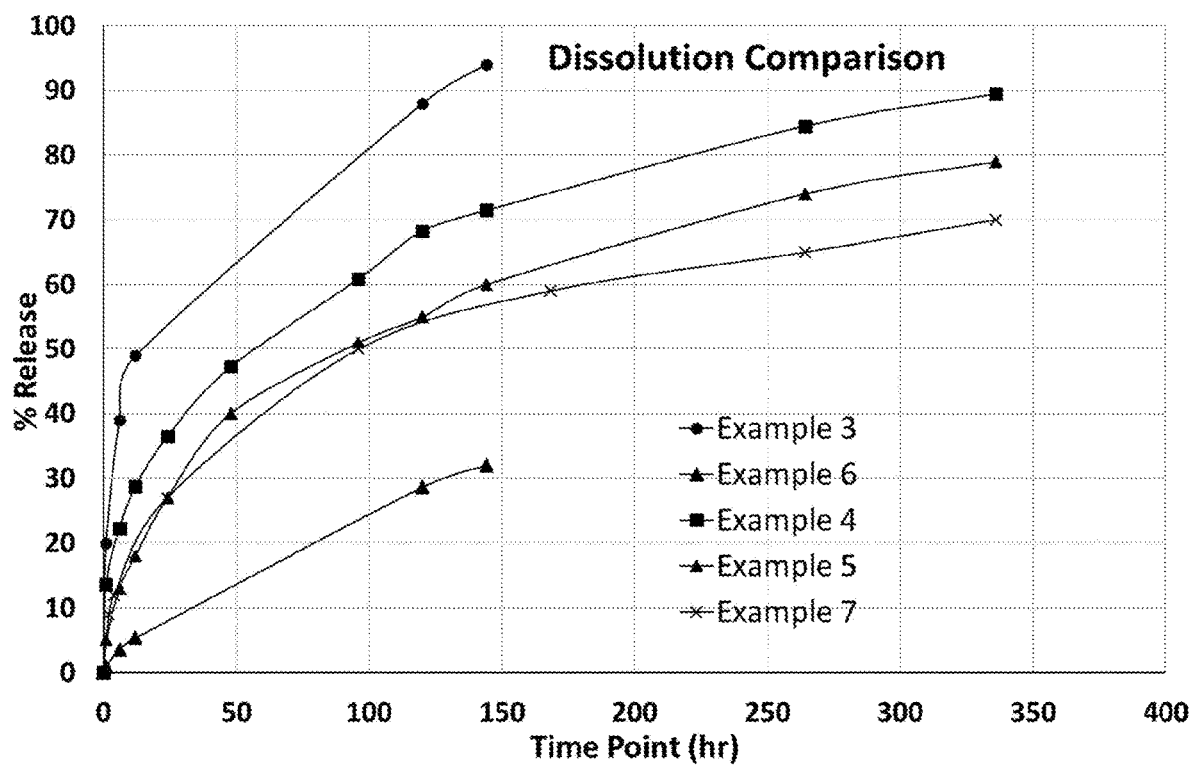
FIG. 5 shows the in vitro release of lenvatinib in several subject compositions.

Properties of terminally sterilized Example 5 are shown in Example 18. Shown in Table 7 below are physical appearance, resuspendability, flowability, injectability and assay data, and in vitro drug release data of terminally sterilized Example 5. FIG. 5 depicts in vitro drug release for several different lenvatinib formulations listed in Table 2.

TABLE 7

Terminally sterilized example 5

| Test | Initial |
|---|---|
| Appearance and Resuspendability | White opaque flowable gel. Easily resuspendable by manual handshake. Uniform gel. |
| Flowability | Chilled: flowable |
| | Room Temp: flowable |
| | 37° C.: flowable |
| Injectability of Chilled Gel | 27 G: Injectable |
| | 31 G: Injectable |
| Assay | 96.7% of label claim |

| In-Vitro Drug Release (IVRT)* | Hours | % cumulative release |
|---|---|---|
| | 0 | 0 |
| | 1 | 11 |
| | 6 | 16 |
| | 12 | 18 |
| | 24 | 23 |
| | 48 | 30 |
| | 96 | 36 |
| | 120 | 41 |
| | 144 | 44 |
| | 264 | 50 |
| | 336 | 53 |

*using USP Apparatus 2 (paddle).

Example 19

A rabbit study was carried out to evaluate the duration of residence of lenvatinib in 3 gel formulations. Rabbits in each group (Formulations listed as examples 3, 6, 4, for Groups 1, 2, 3, respectively) were administered with a 1% lenvatinib gel formulation once in each eye via intravitreal (IVT) injection at 0.5 mg eye.

In all groups, as expected the highest concentrations of lenvatinib were detected in the vitreous humor, retina, and choroid over time. Concentrations of lenvatinib steadily decreased in Groups 1 and 3 in the vitreous humor, retina, and choroid, but remained relatively steady in Group 2 over 20 weeks post the IVT dose. Concentrations of lenvatinib in the ocular tissues from Group 1 had low to no quantifiable levels of lenvatinib by Weeks 12. Group 2 had steady concentrations of lenvatinib out to Week 20 in all ocular tissues examined. Group 3 ocular tissues concentrations of lenvatinib were general steady out to Week 12 and then by Week 20 quantifiable concentrations of lenvatinib was sporadic.

TABLE 8

Plasma concentrations in Dutch Belted rabbits following single IVT injection of lenvatinib 1% gel

| Group | Week | Concentration (ng/mL) |
|---|---|---|
| Group 1 | 2 | 55.3 |
| | 6 | 4.67 |
| | 12 | <LLOQ |
| | 20 | <LLOQ |
| Group 2 | 2 | 11.4 |
| | 6 | 3.49 |
| | 12 | 7.53 |
| | 20 | 4.50 |
| Group 3 | 2 | 32.1 |
| | 6 | 9.76 |
| | 12 | 2.48 |
| | 20 | <LLOQ |

LLOQ = 0.2 ng/mL

Given the rate-limiting compartment being the vitreous humor, plasma concentrations appeared to parallel those in the ocular tissues but in a much lower magnitude. Plasma lenvatinib concentrations were quantifiable up to Week 6 from Group 1, quantifiable throughout Week 20 from Group 2, and quantifiable at Week 12 but not at Week 20 for Group 3 (Table 8).

TABLE 9

Residence time and lenvatinib remaining in vitreous humor after single IVT injection

| | 1% lenvatinib (50 µL) on Gel | | |
|---|---|---|---|
| Formulation | Group 1 | Group 2 | Group 3 |
| Formulation residence time | 5-6 weeks | >20 weeks | 11-14 weeks |
| | Drug Remaining in Vitreous Humor: Average Recovery (% Dose) | | |
| Day 14 (2 weeks) | 27.7% | 57.9% | 35.5% |
| Day 42 (6 weeks) | 1.01% | 47.1% | 6.02% |
| Day 84 (12 weeks) | <0.01% | 16.2% | 0.725% |
| Day 140 (20 weeks) | <0.01% | 7.78% | <0.01% |

Table 9 shows the recoveries of the lenvatinib dose remaining in the vitreous humor after a single IVT injection with different formulations. Lenvatinib recovery in Group 1 was approximately 28% at Week 2 and then reduced to an insignificant percentage by Week 20. Lenvatinib recovery in Group 2 at week 2 was approximately 58% and reduced to approximately 8% by Week 20; the formulation administered to Group 2 has the longest residence time in the vitreous humor. In Group 3, lenvatinib recovery in vitreous humor was approximately 36% at Week 2 and reduced to an insignificant percentage by Week 20.

Figure 6:
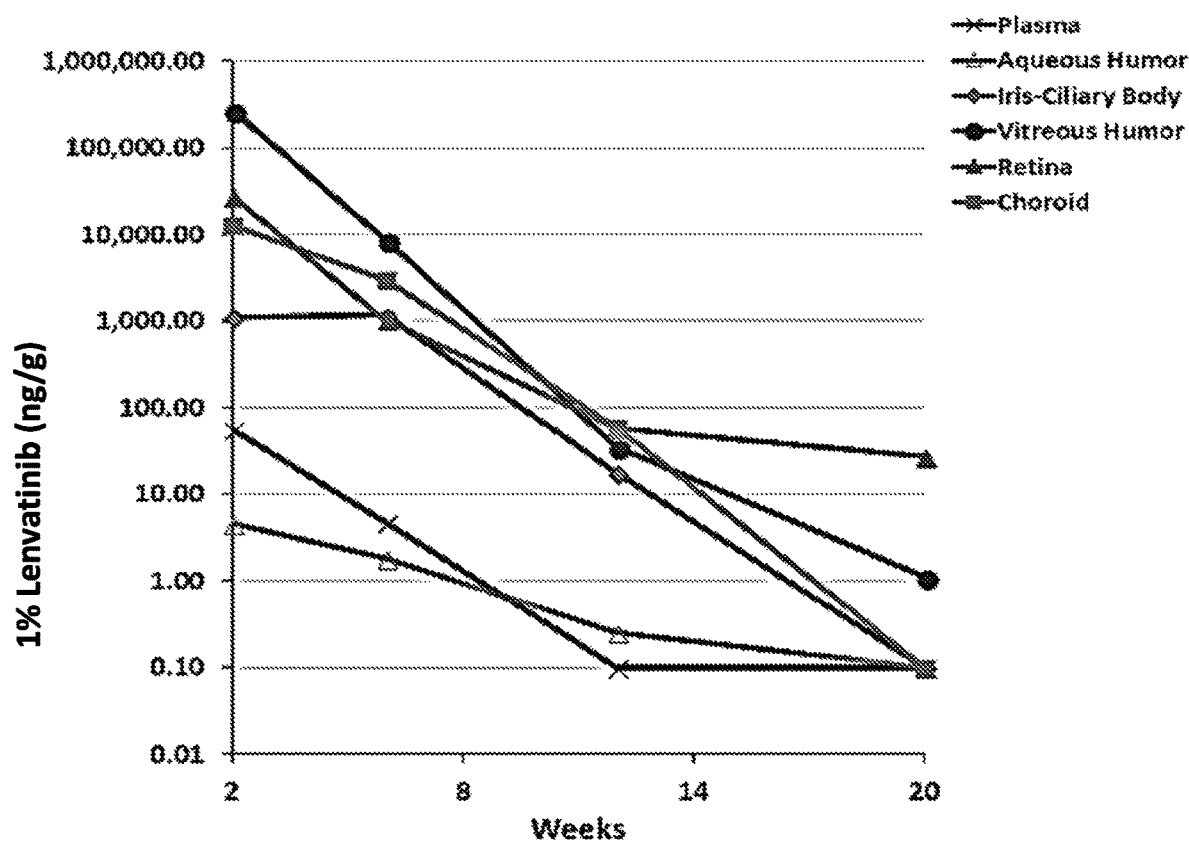
FIG. 6 shows the concentration in ocular tissues after a single intravitreal injection of 1% lenvatinib in a subject composition.
Figure 7:
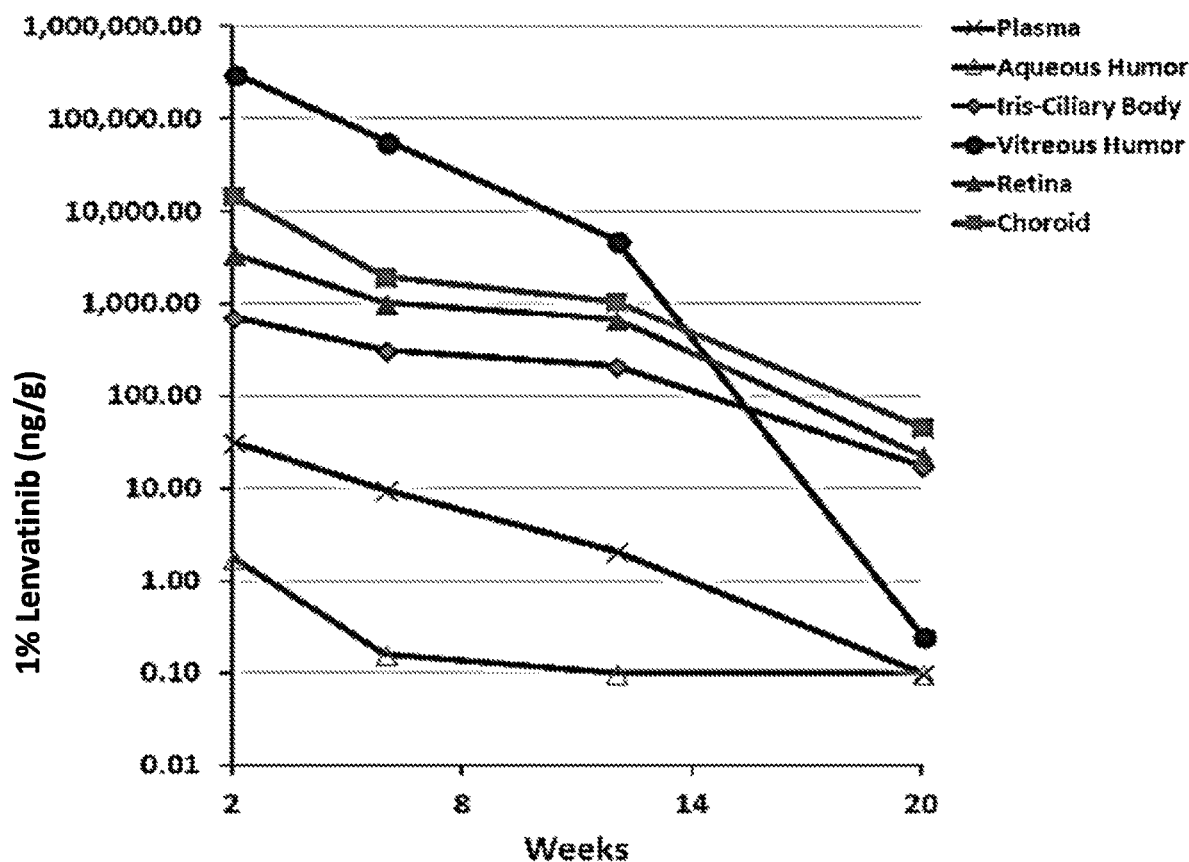
FIG. 7 shows the concentration in ocular tissues after a single intravitreal injection of 1% lenvatinib in a subject composition.
Figure 8:
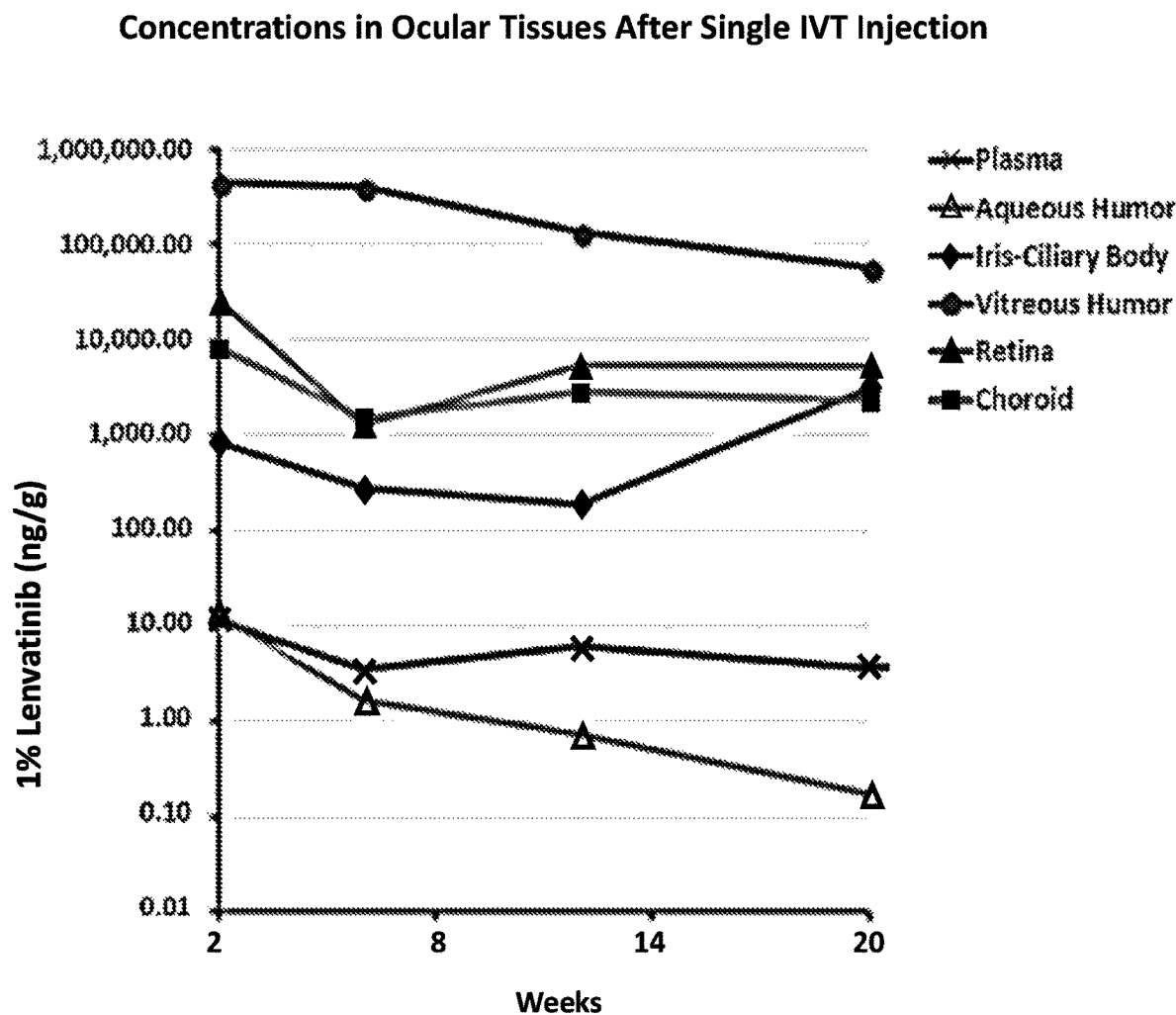
FIG. 8 shows the concentration in ocular tissues after a single intravitreal injection of 1% lenvatinib in a subject composition.

Fundus imaging of formulation dispersion was performed for each eye continuously on Days 0 (after dose), 3, 7, 14, 28, 42, 84, and 140. The fundus image and ocular tissue concentration results paralleled each other. Groups 1 and 3 demonstrated a faster drug release than the Group 2. The Group 2 demonstrated prolonged release of lenvatinib throughout a 20-week study duration, as demonstrated by steady lenvatinib concentrations in ocular tissues and plasma over time (FIGS. 6-8)

Example 20

A rat study was carried out to evaluate the duration of residence of lenvatinib gel after receiving a single intraprostatic injection.

Twelve rats in each group (Groups 1, 2, 3) were dosed with 3 different gel formulations of 1% lenvatinib (example 3, 4, and 6) and at two doses (0.2 and 2 mg). Plasma samples were collected on Study Days 3, 7, 14, 21, 28, 42, and 60 post dose. Prostrates were harvested from these rats following termination on Day 60.

After a single 0.2 mg dose of lenvatinib, the average maximal plasma concentration of lenvatinib was 9.15, 12.0 and 5.24 ng/mL for the Group 1, 2, and 3 animals respectively. The maximal dose concentration was on Day 3. The plasma lenvatinib concentrations were detectable through Day 14, 42, and 60 post dose in Group 1, 2, and 3 respectively. The LLOQ was 0.100 ng/mL (Table 10).

TABLE 10

Average plasma concentrations after a single intraprostatic injection of different formulations of 1% lenvatinib to rats

| Test Article | Dose Level (mg/animal) | \multicolumn{7}{c}{Timepoint (day after the single intraprostatic injection on Day 1)} | | | | | | |
|---|---|---|---|---|---|---|---|---|
| | | 3 | 7 | 14 | 21 | 28 | 42 | 60 |
| Group 1 | 0.2 | 9.15 | 3.36 | 1.63 | <LLOQ | <LLOQ | <LLOQ | <LLOQ |
| | 2.0 | 157 | 73.9 | 43 | 15.6 | 11.5 | 1.72 | <LLOQ |
| Group 2 | 0.2 | 12 | 4.45 | 1.59 | 0.269 | 0.0858 | 0.0539 | <LLOQ |
| | 2.0 | 103 | 56.8 | 42.3 | 20.6 | 12.1 | 2.32 | 0.934 |
| Group 3 | 0.2 | 5.24 | 2.63 | 2.24 | 1.48 | 0.805 | 0.627 | 0.561 |
| | 2.0 | 24.2 | 11.8 | 12.4 | 7.84 | 5.92 | 5.08 | 5.68 |

LLOQ = 0.1 ng/mL

After delivering 2 mg of lenvatinib to rats, the maximal prostate concentration, after 60 days, of lenvatinib was in Group 3, with the highest average concentration in the ventral lobe (494,000 ng/g). The dorsolateral lobe had an average concentration of 127,000 ng/g. The 0.2 mg/animal for Group 3, ventricle lobe had an average concentration of 13,500 ng/g, the dorsolateral lobe had an average concentration of 2450 ng/g. Tissue concentrations for the Groups 1 and 2 were essentially not detectable or very low, after 60 days, relative to the Group 3 animals. Prostate summary data is presented in Table 11.

TABLE 11

Average prostate concentrations of lenvatinib on day 60 after a single intraprostatic injection of different formulations of 1% lenvatinib to Sprague Dawley rats

| Test Article | Dose Level (mg/animal) | VP- (ng/g) | DLP (ng/g) |
|---|---|---|---|
| Group 1 | 0.2 | 0.41 | 7.8 |
| | 2.0 | 0.505 | 1.37 |
| Group 2 | 0.2 | <LLOQ | <LLOQ |
| | 2.0 | <LLOQ | 343 |
| Group 3 | 0.2 | 13,500 | 2450 |
| | 2.0 | 49,400 | 127,000 |

LLOQ = 0.2 ng/mL or 0.8 ng/g;
VP: ventral lobe of prostate,
DLP: dorsolateral lobe of prostate For each of the three formulations, there was dose dependency in the plasma concentration-time profile (Table 10). All 3 formulations demonstrated prolonged drug release from the dosing site of prostate to the plasma compartment, with $C_{max}$ observed on Day 3. The drug release "half-life" was approximately 6, 8, and 43 days for Group 1, 2 and 3, respectively. Both Groups 1 and 2 achieved higher $C_{max}$ than Group 3, but Group 3 maintained plasma concentration much longer than Groups 1 and 2.

Table 11 shows a controlled and sustained drug delivery system for prostate; that is in Table 11 Group 3 had the highest percentage dose remaining in the prostate on Day 60, about 2.7% and 12.7% for the 0.2 mg and 2 mg dose groups, respectively.

The following embodiments are specifically contemplated:

Embodiment 1. A pharmaceutical composition comprising a reverse thermal gelation material, wherein the pharmaceutical composition makes a transition from liquid to gel near the body temperature of a mammal.

Embodiment 2. The pharmaceutical composition of embodiment 1, wherein the mammal is a human being.

Embodiment 3. The pharmaceutical composition of embodiment 2, further comprising at least one active pharmaceutical ingredient, Embodiment 4. The pharmaceutical composition of embodiment 2 or 3, wherein the pharmaceutical composition is a liquid at about 5° C.

Embodiment 5. The pharmaceutical composition of embodiment 1, 2, 3, or 4, wherein the pharmaceutical composition is a gel between about 35° C. and 40° C.

Embodiment 6. The pharmaceutical composition of embodiment 1, 2, 3, 4, or 5, further comprising methylcellulose, dimethyl sulfoxide and citrate.

Embodiment 7. A pharmaceutical composition comprising: an active pharmaceutical ingredient, methylcellulose, dimethyl sulfoxide and citrate.

Embodiment 8. The pharmaceutical composition of embodiment 6 or 7, wherein the methylcellulose is present at a concentration of about 2% (w/w) to about 10% (w/w).

Embodiment 9. The pharmaceutical composition of embodiment 6, 7, or 8, wherein the citrate is present at a concentration of about 25 mmole/kg to about 200 mmole/kg.

Embodiment 10. The pharmaceutical composition of embodiment 1, 2, 3, 4, 5, 6, 7, or 9, having a pH of about 5.0 to about 9.0.

Embodiment 11. The pharmaceutical composition of embodiments 1, 2, 3, 4, 5, 6, 7, 8, 9, or 10, having a first storage modulus (G') at about 37° C. and a second G' at about 5° C., wherein the first G' is higher than the second G'.

Embodiment 12. The pharmaceutical composition of embodiment 11, wherein the first G' is at least about tenfold higher than the second G'.

Embodiment 13. The pharmaceutical composition of embodiments 1, 2, 3, 4, 5, 6, 7, 8, 9, 10, 11, or 12, having a first complex viscosity at about 37° C. and a second complex viscosity at about 5° C., wherein the first complex viscosity is higher than the second complex viscosity.

Embodiment 14. The pharmaceutical composition of embodiment 13, wherein the first complex viscosity is at least twofold higher than the second complex viscosity.

Embodiment 15. The pharmaceutical composition of embodiments 1, 2, 3, 4, 5, 6, 7, 8, 9, 10, 11, 12, 13, or 14 having a first loss modulus (G") at about 37° C. and a second G" at about 5° C., wherein the first G" is higher than the second G".

Embodiment 16. The pharmaceutical composition of embodiment 1, 2, 3, 4, 5, 6, 7, 8, 9, 10, 11, 12, 13, 14, or 15, wherein the % gelation at about 37° C. is at least 70%.

Embodiment 17. The pharmaceutical composition of embodiment 1, 2, 3, 4, 5, 6, 7, 8, 9, 10, 11, 12, 13, 14, 15, or 16, wherein the % gelation at about 5° C. is no greater than 10%.

Embodiment 18. A method of treating a disease, comprising administering a pharmaceutical composition of embodiment 1, 2, 3, 4, 5, 6, 7, 8, 9, 10, 11, 12, 13, 14, 15, 16, or 17 to a mammal in need thereof.

Embodiment 19. The method of embodiment 18, wherein the mammal is a human being.

Embodiment 20. Use of a pharmaceutical composition of embodiment 1, 2, 3, 4, 5, 6, 7, 8, 9, 10, 11, 12, 13, 14, 15 16 or 17 in the manufacture of a medicament for treating a disease.

The invention claimed is:

1. A pharmaceutical composition comprising a reverse thermal gelation material, wherein the pharmaceutical composition makes a transition from liquid to gel near the body temperature of a mammal, and wherein the pharmaceutical composition further comprises an active pharmaceutical ingredient designed for anti-angiogenesis, wherein the active pharmaceutical ingredient comprises axitinib, nintedanib, pirfenidone, riociguat, sorafenib, sunitinib, lenvatinib, regorafenib, ponatinib, pazopanib, or a combination thereof, and wherein the pharmaceutical composition comprises about 2% (w/w) to about 10% (w/w) methylcellulose, wherein the methylcellulose is methylcellulose A15LV.

2. The pharmaceutical composition of claim 1, wherein the mammal is a human being.

3. The pharmaceutical composition of claim 1, wherein the pharmaceutical composition is a liquid at a temperature of about 2° C. to about 8° C., and wherein the pharmaceutical composition is a gel at a temperature of about 30° C. to about 40° C.

4. The pharmaceutical composition of claim 1, a gelation modulator.

5. The pharmaceutical composition of claim 4, wherein the gelation modulator comprises phosphate, dihydrogen phosphate, hydrogen phosphate, tris (hydroxymethyl)aminomethane, borate, histidine, carbonate, bicarbonate, citrate, citric acid acetate, tartarate, fumarate, lactate, formate, sulfamate, oxalate, malonate, succinate, maleate, adipate, benzoate, o-toluate, benzene tetracarboxylate, glutamate, e-amino caproate, aspartate, glycinate, arginate, lysinate, taurate, ethanol, dimethyl sulfoxide, glycerin, dimethylformamide, propylene glycol, a polyethylene glycol, a vegetable oil, corn oil, olive oil, castor oil, vitamin E, a phospholipid, a polysorbate 20, a polysorbate 40, a polysorbate 60, a polysorbate 80, a mono-saccharide, a di-saccharide, dextrose, sucrose, a sugar alcohol, mannitol, sorbitol, an antioxidant, ascorbic acid, butylated hydroxyanisole, butylated hydroxytoluene, sodium bisulfate, sodium sulfite, sodium metabisulfite, EDTA, sodium carboxymethylcellulose, sodium alginate, hydroxypropylmethylcelluloses, carbomers, hyaluronic acid, a hyaluronate salt, or a combination thereof.

6. A pharmaceutical composition comprising: an active pharmaceutical ingredient, methylcellulose, dimethyl sulfoxide and citrate, wherein the methylcellulose is A15LV, wherein the methylcellulose is present at a concentration of about 2% (w/w) to about 10% (w/w), and the citrate is present at a concentration of about 25 mmol/kg to about 200 mmole/kg.

7. The pharmaceutical composition of claim 6 further comprising phosphate.

8. The pharmaceutical composition of claim 6, having a pH of about 5.0 to about 9.0.

9. The pharmaceutical composition of claim 1, wherein the pharmaceutical composition has a first storage modulus (G') at about 37° C. and a second G' at about 5° C., wherein the first G' is at least about tenfold higher than the second G'.

10. The pharmaceutical composition of claim 9, having a first complex viscosity at about 37° C. and a second complex viscosity at about 5° C., wherein the first complex viscosity is at least twofold higher than the second complex viscosity.

11. The pharmaceutical composition of claim 9, having a first loss modulus (G") at about 37° C. and a second G" at about 5° C., wherein the first G" is higher than the second G".

12. The pharmaceutical composition of claim 11, wherein the % gelation at about 37° C. is at least 70%, and wherein the % gelation at about 5° C. is no greater than 20%.

13. A method of treating a disease, comprising administering the pharmaceutical composition of claim 1 to a human being in need thereof, wherein the disease is characterized by chronic inflammation with associated angiogenesis and fibrosis.

14. The method of claim 13, wherein the disease comprises a dermal-related disorder, a benign prostate hyperplasia related disorder, an eye-related disorder, a rosacea-related disorder, a uterine fibroid or a related condition, a neoplastic disease, or an adhesion-related disorder.

15. The method of claim 13, wherein the pharmaceutical composition is administered topically, by intralesional injection, by paralesional injection, by intravitreal injection, by intraprostatic injection, by intramuscular injection, by subcutaneous injection, by intradermal injections, by intratissue injection, or by eye drop.

16. A method of delivering an active pharmaceutical ingredient, comprising administering the pharmaceutical composition of claim 1, to a human being in need of the active pharmaceutical ingredient, wherein the composition provides a therapeutic effect with a reduced active pharmaceutical ingredient dosing frequency.

17. The method of claim 16, wherein the pharmaceutical composition is administered topically, by intralesional injection, by perilesional injection, by intravitreal injection, by intraprostatic injection, by intramuscular injection, by subcutaneous injection, by intradermal injections, by intratissue injection, or by eye drop.

18. The method of claim 16, wherein a single administration of the active pharmaceutical ingredient provides a therapeutically effective concentration of the active pharmaceutical ingredient to the mammal for at least 5 days.

19. A method of preparing the pharmaceutical composition of claim 6 having reverse thermal gelation properties, comprising:
  mixing a polymer agent into a slurry containing a gelation modulator and an active pharmaceutical ingredient, wherein the mixing occurs at a temperature of about 60° C. to about 80° C.;
  wherein the slurry is formed by a method comprising precipitating the active pharmaceutical ingredient into an aqueous liquid, and adding the gelation modulator to the slurry.

* * * * *